United States Patent
Setlur et al.

(10) Patent No.: US 6,809,471 B2
(45) Date of Patent: Oct. 26, 2004

(54) PHOSPHORS CONTAINING OXIDES OF ALKALINE-EARTH AND GROUP-IIIB METALS AND LIGHT SOURCES INCORPORATING THE SAME

(75) Inventors: Anant Achyut Setlur, Niskayuna, NY (US); Alok Mani Srivastava, Niskayuna, NY (US); Holly Ann Comanzo, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 71 days.

(21) Appl. No.: 10/064,285

(22) Filed: Jun. 28, 2002

(65) Prior Publication Data

US 2004/0000862 A1 Jan. 1, 2004

(51) Int. Cl.$^7$ ............................. H01J 1/62; C09K 11/08
(52) U.S. Cl. ........................ 313/503; 313/501; 313/502; 252/301.4 R; 252/301.4 P; 252/301.4 H
(58) Field of Search .......................... 313/512, 498–511, 313/486; 252/301.4 R, 301.4 H, 301.4 P

(56) References Cited

U.S. PATENT DOCUMENTS

| | | |
|---|---|---|
| 5,424,006 A | 6/1995 | Murayama et al. |
| 5,611,959 A | 3/1997 | Kijima et al. |
| 5,686,022 A | 11/1997 | Murayama et al. |
| 5,725,801 A | 3/1998 | Guo et al. |
| 5,777,350 A | 7/1998 | Nakamura et al. |
| 5,788,882 A * | 8/1998 | Kitai et al. ............ 252/301.4 R |
| 5,989,455 A | 11/1999 | Hisamune et al. |
| 5,998,925 A | 12/1999 | Shimizu et al. |
| 6,066,861 A * | 5/2000 | Hohn et al. ............... 257/99 |
| 6,190,577 B1 | 2/2001 | Hase et al. |
| 6,278,135 B1 | 8/2001 | Srivastava et al. |

FOREIGN PATENT DOCUMENTS

| | | |
|---|---|---|
| DE | 9422359 | 9/2000 |
| EP | 0622440 A | 11/1994 |
| EP | 0990690 A | 4/2000 |
| EP | 1120452 A | 8/2001 |

OTHER PUBLICATIONS

S. Shionoya and W. M. Yhen, Phosphor Handbook, pp. 389–444, CRD Press, Boca Raton, Florida (1999).

* cited by examiner

*Primary Examiner*—Ashok Patel
*Assistant Examiner*—German Colón
(74) *Attorney, Agent, or Firm*—Toan P. Vo; Patrick K. Patnode

(57) ABSTRACT

Phosphors comprises oxides of at least an alkaline-earth metal selected from the group consisting of strontium, barium, calcium, and combinations thereof and at least a Group-IIIB metal selected from the group consisting of aluminum, gallium, indium, and combinations thereof activated with rare-earth metal ions comprising at least europium. The phosphors are characterized in that the ratio of positive ions and negative ions is off-stoichiometric. The phosphors are excitable efficiently in the near UV-to-blue light range. Blends containing at least one of these phosphors in conjunction with at least a light-emitting diode can provide light sources having a high luminosity and a high color-rendering index.

64 Claims, 4 Drawing Sheets

PHOSPHORS CONTAINING OXIDES OF ALKALINE-EARTH AND GROUP-IIIB METALS AND LIGHT SOURCES INCORPORATING THE SAME

FEDERAL RESEARCH STATEMENT

This invention was first conceived or reduced to practice in the performance of work under contract 70NANB8H4022 awarded by the United States National Institute of Standards and Technology. The United States of America may have certain rights to this invention.

BACKGROUND OF THE INVENTION

The present invention relates to phosphors containing oxides of alkaline-earth and Group-IIIB metals activated with rare-earth ions. In particular, the present invention relates to phosphors containing oxides of alkaline-earth and Group-IIIB metals activated with at least europium ions wherein the ratio of positive ions and negative ions is off-stoichiometric. The present invention also relates to light sources incorporating such phosphors.

A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert the ultraviolet ("UV") radiation emitted by the excited mercury vapor to visible light. Other phosphors are capable of emitting visible light upon being excited by electrons (used in cathode ray tubes) or x rays (for example, scintillators in x-ray detection systems).

The efficiency of a lighting device that uses a phosphor increases as the difference between the wavelength of the exciting radiation and that of the emitted radiation narrows. Therefore, in the quest for improving efficiency of white light sources, effort has been dedicated to finding a source of stimulating radiation that has wavelengths in the range of near-UV to blue visible light and phosphors that respond to those wavelengths. The term "near-UV" means UV radiation having wavelengths in the range from about 315 nm to about 400 nm. Recent advances in light-emitting diode ("LED") technology have brought efficient LEDs emitting in the near-UV-to-blue range. These LEDs emitting radiation in the near UV-to-blue range will be hereinafter called "UV/blue LEDs." As used herein, a UV/blue LED may emit radiation having wavelengths in the near UV range, in the blue light range, or in a broad range from near UV to blue. It would be an advance to the technology of lighting to provide a range of phosphors that can be stimulated by the radiation emitted from these UV/blue LEDs radiation sources to allow for a flexibility in the use of phosphors for generating various color LEDs. Such phosphors when combined with the emission from the UV/blue LEDs can provide efficient and long lasting lighting devices that consume little power.

Many near UV/blue LEDs based on combinations of nitrides of indium, aluminum, and gallium have recently appeared. For example, U.S. Pat. No. 5,777,350 disclosed LEDs comprising multiple layers of indium and gallium nitrides and p- and n-type AlGaN, which emit in the wavelength range of about 380 nm to about 420 nm. The active layer of such a LED may be doped with other materials to shift the LED peak emission within the UV-to-blue wavelength range. A LED having a peak emission in the blue light wavelengths was combined with a coating of a yellow light-emitting yttrium aluminum garnet phosphor activated with cerium ("YAG:Ce") to produce white light is disclosed in U.S. Pat. No. 5,998,925. Although a substantial portion of the need for white light devices may be filled by LED-based devices, the ability to combine a UV/blue LED with a phosphor has been limited because YAG:Ce has been the only known yellow light-emitting phosphor that is excitable by radiation in the blue range.

White light can also be generated by mixing blue, green, and red light. Therefore, it is desirable to provide novel efficient phosphors that are excitable in the near UV-to-blue range and emit in these colors. It is especially desirable to provide efficient green-emitting phosphors because well-known green-emitting phosphors are largely excitable in the mid-UV wavelength range (about 200–300 nm). It is also desirable to provide novel phosphor blends that can be combined with UV/blue LEDs to produce white light of high efficiency and/or high color rendering index ("CRI").

SUMMARY OF INVENTION

The present invention provides phosphors containing oxides of alkaline-earth and Group-IIIB metals activated with rare-earth ions activated with rare-earth metal ions that are excitable by radiation having wavelengths in the near UV-to-blue range (from about 315 nm to about 480 nm) to emit efficiently in the range of green-to-yellow visible light from about 480 nm to about 600 nm. In general, the phosphors of the present invention are oxides of alkaline-earth and Group-IIIB metals doped with at least europium ions that act as an activator. One or more other rare-earth metal ions can be included as a co-activator, which other rare-earth metal ions are selected from the group consisting of ions of cerium, praseodymium, neodymium, samarium, gadolinium, dysprosium, holmium, erbium, thulium, ytterbium, and lutetium: The phosphor of the present invention has a general formula of $$(M_{1-x}RE_x)_yD_2O_4;$$

wherein M is an alkaline-earth metal selected from the group consisting of Sr, Ba, Ca, and combinations thereof; RE is a rare-earth metal comprising at least europium; D is at least a metal of Group IIIB of the Periodic Table selected from the group consisting of aluminum, gallium, indium, and combinations thereof; $0.001<x<0.3$, and y satisfies a condition selected from the group consisting of $0.75<y<1$ and $1<y<1.1$.

In one aspect of the present invention, the phosphor can further comprise magnesium.

In another aspect of the present invention, a method for producing a phosphor comprising oxides of at least an alkaline-earth metal and at least a Group-IIIB metal activated with at least europium, which method comprises the step of: (a) providing amounts of compounds of: at least a rare-earth metal comprising at least europium; at least an alkaline-earth metal selected from the group consisting of strontium, barium, calcium, and combinations thereof; and at least a Group-IIIB metal selected from the group consisting of aluminum, gallium, indium, and combinations thereof; the amounts being chosen such that the final composition of the phosphor is achieved; (b) optionally adding at least one fluxing compound selected from the group consisting of halides of at least a metal selected from the group consisting of strontium, barium, calcium, aluminum, gallium, indium, and rare-earth metals; (c) mixing together the compounds; and (d) firing the mixture in a reducing atmosphere at a temperature and for a time sufficient to convert the mixture to a phosphor comprising oxides of at least an alkaline-earth metal and at least a Group-IIIB metal activated with at least europium.

In still another aspect of the present invention, the method further comprises the step of converting the compounds of the mixture into oxygen-containing compounds before firing in the reducing atmosphere.

In still another aspect of the present invention, a light source emitting visible light comprises a UV/blue LED and at least said phosphor comprising oxides of at least an alkaline-earth metal and at least a Group-IIIB metal activated with at least europium.

Other features and advantages of the present invention will be apparent from a perusal of the following detailed description of the invention and the accompanying drawings in which the same numerals refer to like elements.

DETAILED DESCRIPTION

Figure 1:
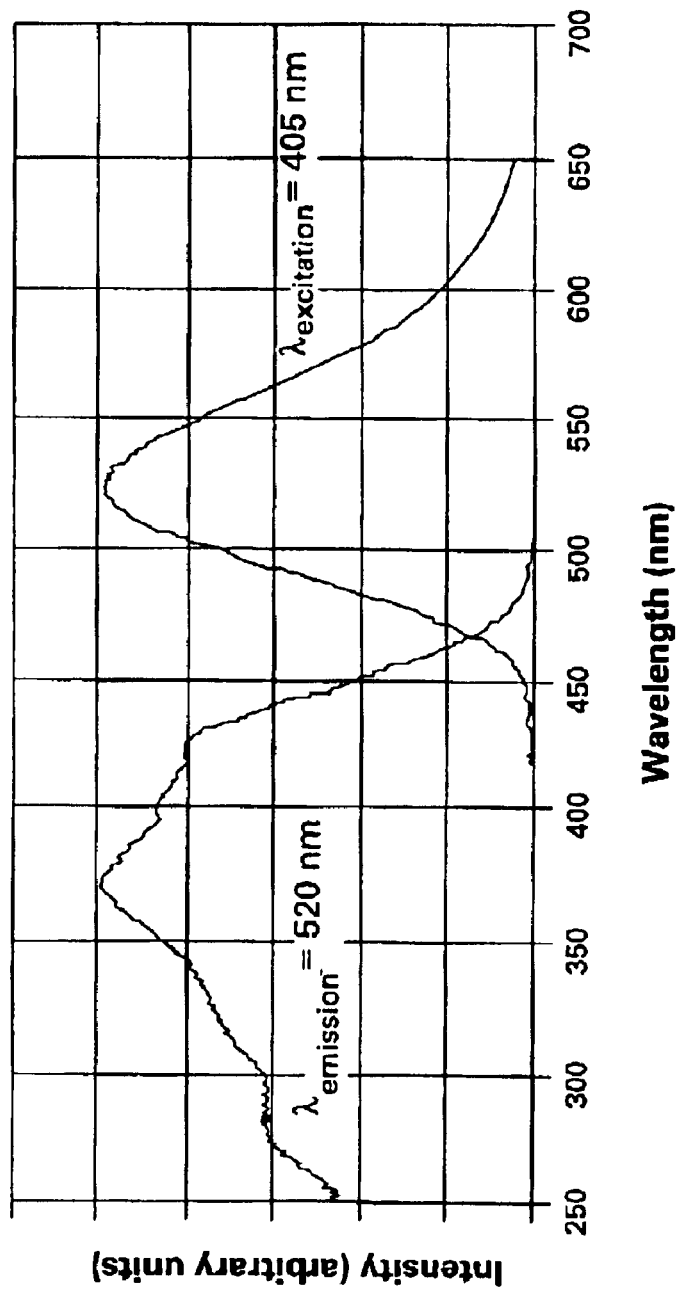
FIG. 1 shows excitation and emission spectra of the phosphor $Sr_{0.8}Eu_{0.1}Al_2O_4$.

The present invention provides phosphors that are efficiently excitable by radiation having wavelengths in the near UV-to-blue range (from about 315 nm to about 480 nm) and emit efficiently in the green-to-yellow visible light from about 480 nm to about 600 nm. The terms "electromagnetic radiation," "radiation," and "light" are used interchangeably herein to mean electromagnetic radiation having a wavelength in the range from UV to deep red (from about 100 nm to about 800 nm). In particular, a phosphor of the present invention has a peak emission in the range of maximum sensitivity of the human eye. In this disclosure, a metal exists in a combined form with a counter-ion rather than as a zero-valent metal. A phosphor of the present invention comprises oxides of at least an alkaline-earth metals and at least a Group-IIIB metal doped with at least a rare-earth metal ion comprising at least europium. The phosphor has a general formula of $$(M_{1-x}RE_x)_yD_2O_4;$$

wherein M is an alkaline-earth metal selected from the group consisting of Sr, Ba, Ca, and combinations thereof; RE is a rare-earth metal comprising at least europium; D is at least a metal of Group IIIB of the Periodic Table selected from the group consisting of aluminum, gallium, indium, and combinations thereof; $0.001<x<0.3$, and y satisfies a condition selected from the group consisting of $0.75<y<1$ and $1<y<1.1$.

In one preferred embodiment, the phosphor has a formula of $Al_2O_4$; wherein $0.001<x<0.3$, and y satisfies a condition selected from the group consisting of $0.75<y<1$ and $1<y<1.1$.

In another embodiment of the present invention, the phosphor is further co-activated with another rare-earth metal ion selected from the group consisting of ions of cerium, praseodymium, neodymium, samarium, gadolinium, dysprosium, holmium, erbium, thulium, ytterbium, and lutetium. Such other rare-earth metal ions can comprise from about 0.001 to about 30 atom percent, preferably from about 0.001 to about 20 atom percent, more preferably from about 0.001 to bout 10 atom percent of the total alkaline-earth metals and rare-earth metals. A preferred co-activator is dysprosium.

In another aspect of the present invention, the phosphor can further comprise magnesium in an amount from about 0.001 to about 20 atom percent of the alkaline-earth metal.

A phosphor of the present invention comprising oxides of at least an alkaline-earth metal and at least a Group-IIIB metal activated with at least europium can be made by a solid-state reaction. The method comprises the steps of: (a) providing amounts of oxygen-containing compounds of: (1) at least a rare-earth metal comprising at least europium; (2) at least an alkaline-earth metal selected from the group consisting of strontium, barium, calcium, and combinations thereof; and (3) at least a Group-IIIB metal selected from the group consisting of aluminum, gallium, indium, and combinations thereof; said amounts being chosen such that the desired composition of the final phosphor is achieved; (b) mixing together said oxygen-containing compounds to form a mixture; and (c) firing the mixture in a reducing atmosphere at a temperature and for a time sufficient to convert the mixture to a phosphor comprising oxides of at least an alkaline-earth metal and at least a Group-IIIB metal activated with at least europium.

In a preferred embodiment, the method further comprises adding, as a flux, a halide of at least a metal selected from the group consisting of strontium, barium, calcium, aluminum, gallium, indium, europium, and combinations thereof to the oxygen-containing compounds before mixing the compounds together. The halide may be added in an amount up to about 20, preferably up to about 10, and more preferably up to about 5 weight percent of the total weight of the mixture. The preferred halide is fluoride.

In another aspect of the invention, the method further comprises adding at least an oxygen-containing compound of at least an additional rare-earth metal to the mixture of oxygen-containing compounds before mixing. The at least an additional rare-earth metal acts as a co-activator in the phosphor and is selected from the group consisting of cerium, praseodymium, neodymium, samarium, gadolinium, dysprosium, holmium, erbium, thulium, ytterbium, and lutetium.

In a preferred embodiment, the oxygen-containing compounds are oxides.

In another aspect of the present invention, the oxygen-containing compounds can be those that decompose to oxides, such as carbonates, nitrates, nitrides, sulfates, sulfites, chlorates, perchlorates, oxyhalides, acetates, citrates, salt of organic acids, and combinations thereof. The oxygen-containing compounds are preferably chosen such that they decompose at a temperature in the range from about 400° C. to about 900° C. The decomposition is typically carried out in air or in a mixture of air and an inert gas, such as nitrogen, helium, argon, neon, krypton, xenon, and mixtures thereof before the step of firing in a reducing atmosphere.

The compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling, especially when the mixture of the oxygen-containing compounds is to be made into a solution for subsequent precipitation. A solvent for wet milling may be an alcohol, such as methanol, ethanol, or propanol. If the mixture is wet, it may be dried first before the step of firing.

The mixture of the oxygen-containing compounds or the oxide products of the decomposition is fired at a temperature from about 900° C. to about 1300° C., preferably from about 1000° C. to about 1200° C., for a time sufficient to convert the mixture to the final phosphor. The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time from about 1 minute to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. A suitable reducing atmosphere comprises about 1–3 volume percent hydrogen in nitrogen. Alternatively, a crucible containing the mixture may be packed in a second closed crucible containing high-purity carbon particles and fired in a limited amount of air so that the carbon particles react with the oxygen present in the air, thereby generating carbon monoxide that is needed to provide the reducing atmosphere. The firing may be carried out at a substantially constant temperature or the temperature may be ramped up from room temperature and then held at the final firing temperature for the duration of the firing. Alternatively, the firing may be done in stages at two or more temperatures, each stage may be carried out in a different reducing atmosphere.

FIG. 1 shows excitation and emission spectra of the phosphor $Sr_{0.8}Eu_{0.1}Al_2O_4$, produced by the solid-state reaction, as described about. In the production of this sample, aluminum fluoride was used as a flux in an amount of about 2 weight percent of the total weight of the mixture. The mixture was fired at about 1100° C. in a first crucible that was disposed in a second crucible packed with carbon particles, under an atmosphere comprising 1 volume percent hydrogen in nitrogen. Note that the phosphor is excited efficiently in the wavelength range from about 350 nm to about 430 nm. The phosphor has a relative quantum efficiency of about 65–70% of a $Sr_4Al_{14}O_{25}:Eu^{2+}$ phosphor ("SAE"), an absorption at 405 nm of about 80%, and CIE coordinates of x=0.276 and y=0.571.

Alternatively, the phosphor may be produced in a wet method. One or more compounds of at least a rare-earth metal comprising europium; at least an alkaline-earth metal selected from the group consisting of strontium, barium, calcium, and combinations thereof; and at least a Group-IIIB metal selected from the group consisting of aluminum, gallium, indium, and combinations thereof may be other than oxides that are soluble in an aqueous solution, such as nitrates, sulfates, acetates, citrates, chlorates, perchlorates, oxyhalides, or organic compounds. Non-limiting examples of these organic compounds are the metal salts of mono- and di-carboxylic acids containing 1 to 6 carbon atoms, esters of di-carboxylic acids containing 1 to 6 carbon atoms, metal salts of aromatic acids having 1 or 2 aromatic rings, metal acetylacetonates, metal alkoxides containing 1 to 6 carbon atoms, and metal phenoxides. For example, compounds of at least a rare-earth metal comprising europium; at least an alkaline-earth metal selected from the group consisting of strontium, barium, calcium, and combinations thereof; and at least a Group-IIIB metal selected from the group consisting of aluminum, gallium, indium, and combinations thereof are blended and dissolved in an acid, such as nitric acid solution. In one embodiment of the present invention, at least one of the compounds, preferably a Group-IIIB compound is a halide, preferably fluoride. The strength of the acid solution is chosen to rapidly dissolve the compounds and the choice is within the skill of a person skilled in the art. Ammonium hydroxide is then added in increments to the acidic solution containing these metals while stirring to precipitate a mixture of hydroxides containing the chosen elements until the precipitation is complete. Typically, this step is complete when the pH of the mixture of the solutions rises above 8. Other ammonium compounds, such as ammonium carbonate or ammonium oxalate, can also be used for the precipitation of compounds of the chosen elements. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. The precipitate is filtered, washed, and optionally dried in air. The precipitate may be optionally heated in air or in a mixture of air and an inert gas at between about 400° C. and about 900° C. for a sufficient time to ensure a substantially complete dehydration of the material and decomposition of any organic materials used. It may be desired to mill or pulverize the dried precipitate before such heating. After decomposition, the mixture comprises substantially oxides of at least europium, at least an alkaline-earth metal, and at least a Group-IIIB metal. The dried precipitate or the decomposed precipitate is then fired in a reducing atmosphere as is disclosed above.

A phosphor of the present invention may be blended with other phosphors to be used in a light source that has high luminosity and CRI. Table 1 compares the results of the simulation of a blend comprising the phosphor $Sr_{0.8}Eu_{0.1}Al_2O_4$ of the present invention and blends comprising phosphors of the prior art. In Table 1, "HALO," "SAE," "SECA," and "BAMn" denote the phosphors $Ca_5(PO_4)_3Cl:Mn^{2+}$, $Eu^{2+}$ (emitting in the yellow-red region), $Sr_4Al_{14}O_{25}:Eu^{2+}$ (emitting in the blue-green region), $(Sr,Ba,Ca)_5(PO_4)_3(Cl,OH):Eu^{2+}$ (emitting in the blue region), and $(Ba,Ca,Sr)Mg_3Al_{14}O_{25}:Eu^{2+},Mn^{2+}$ (emitting in the green region), respectively.

TABLE 1

| Blend | Luminosity (lm/W$_{electrical}$) | CRI | Red (%) | Green (%) | Blue (%) |
|---|---|---|---|---|---|
| HALO/SAE | 296 | 75 | 15.1 | 6.92 | 2.95 |
| HALO/SECA/BAMn | 306 | 93 | 15.7 | 6.54 | 7.97 |
| HALO/SECA/ $Sr_{0.8}Eu_{0.1}Al_2O_4$ | 318 | 87 | 14.1 | 9.25 | 7.8 |

Figure 2:
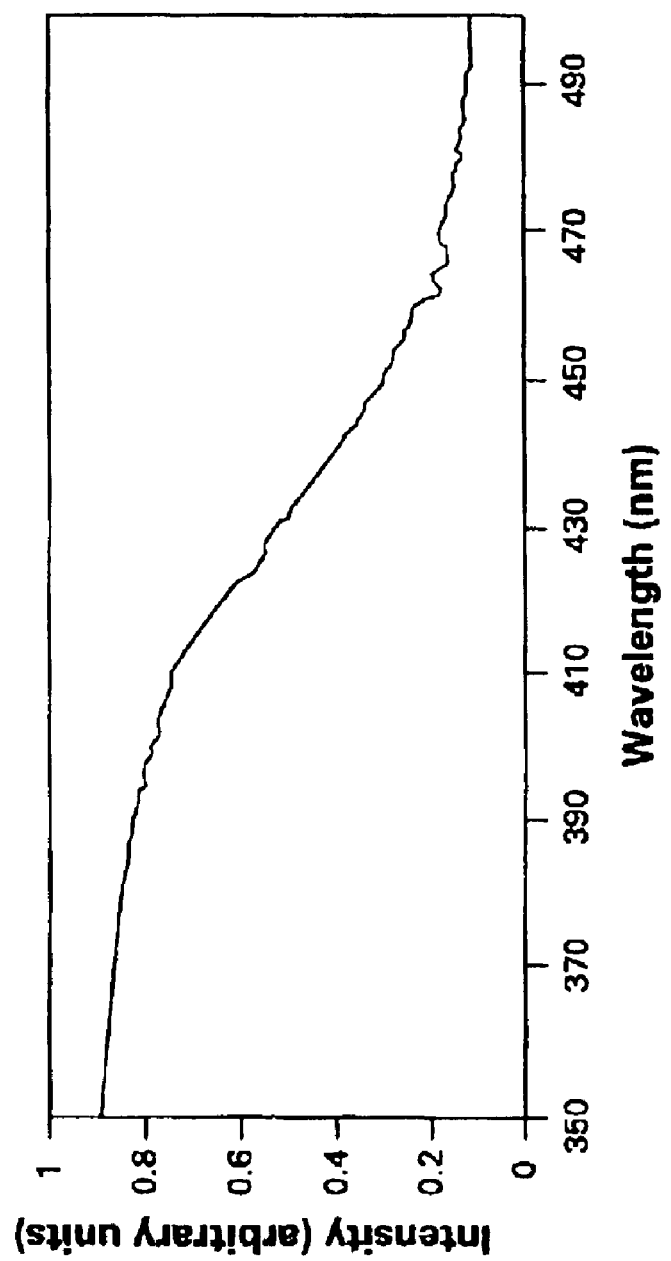
FIG. 2 show the absorption spectrum of a phosphor blend consisting of $Sr_{0.8}Eu_{0.1}Al_2O_4$, $Ca_5(PO_4)_3Cl:Mn^{2+}$, $Eu^{2+}$, and $(Sr,Ba,Ca)_5(PO_4)_3(Cl,OH):Eu^{2+}$.
Figure 3:
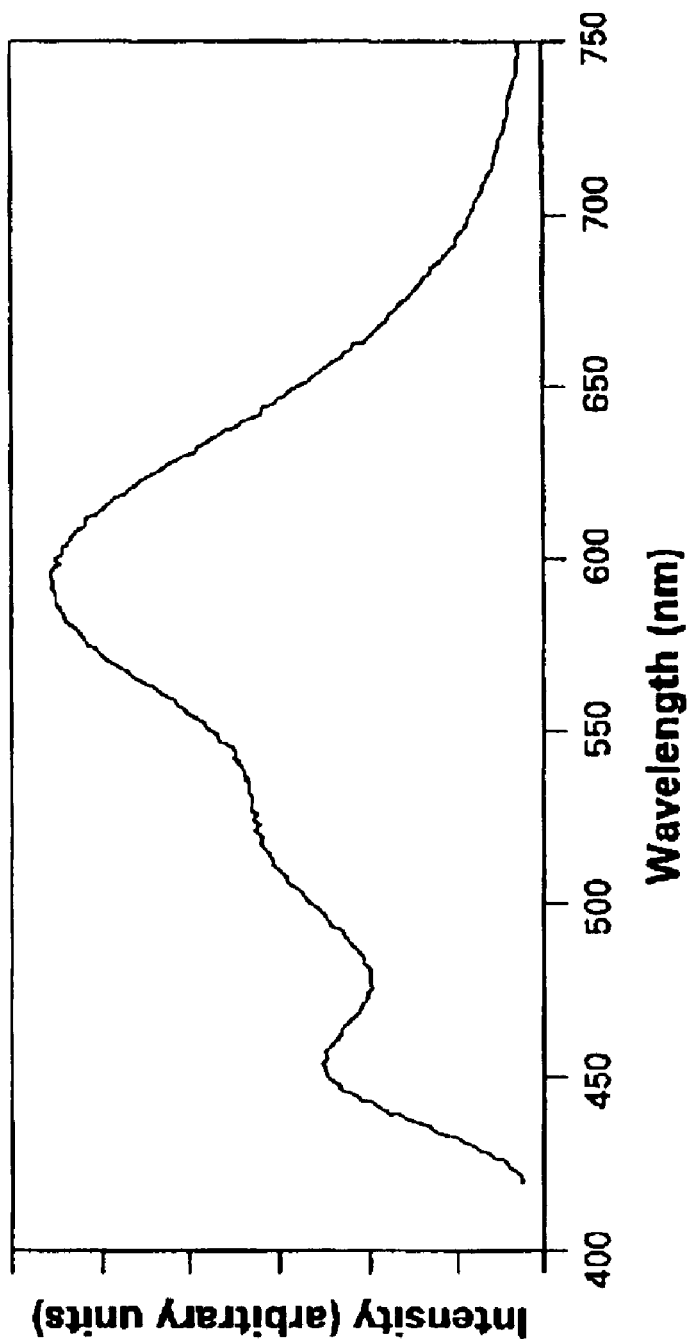
FIG. 3 shows the emission spectrum of the phosphor blend of FIG. 2.

Simulation of the spectral power distribution of another blend of the $Sr_{0.8}Eu_{0.1}Al_2O_4$ of the present invention and HALO and SECA phosphors showed a quantum efficiency of about 90% of the HALO phosphor, an absorption at 405 nm of about 77%, a luminosity of about 340 lm/W$_{electrical}$, a CRI of 82, a correlated color temperature of about 4000 K, and CIE coordinates of x=0.387 and y=0.395, which put this light source nearly on the black body locus. The absorption and emission spectra of this blend are shown in FIGS. 2 and 3. The spectral power distribution of such a phosphor blend can provide illumination similar to fluorescent lamps.

LED-Based White Light-Emitting Device

Incorporation of a phosphor blend that comprises a phosphor of the present invention and other selected phosphors that emit in the blue, yellow, and red regions in a device comprising a LED emitting near UV-to-blue light in the range of about 350 nm to about 450 nm should provide a white light source that uses electrical power efficiently. Such a blend can be that which is described immediately above. Non-limiting examples of blue light-emitting phosphors (peak emission in the range from about 400 nm to about 480 nm) are $(Ba,Sr,Ca)_5(PO_4)_3(Cl,F,OH):Eu^{2+}$ and $(Ba,Sr,Ca)MgAl_{10}O_{17}:Eu^{2+}$. Non-limiting examples of blue-green light-emitting phosphors (peak emission in the range from about 480 nm to about 500 nm) are $Sr_4Al_{14}O_{25}:Eu^{2+}$ ("SAE"), $2SrO.0.84P_2O_5.0.16B_2O_3:Eu^{2+}$, $MgWO_4$, $BaTiP_2O_8$, and $Ca_5(PO_4)_3(Cl,F,OH):Sb^{3+},Mn^{2+}$. Non-limiting examples of green light-emitting phosphors (peak emission in the range from about 500 nm to about 550 nm) are $LaPO_4:Ce^{3+},Tb^{3+}$ ("LAP"), $CeMgAl_{11}O_{19}:Tb^{3+}$, and $GdMgB_5O_{10}:Ce^{3+},Tb^{3+}$ ("CBT"). Non-limiting examples of yellow-orange light-emitting phosphors (peak emission in the range from about 550 nm to about 630 nm) are $Y_3Al_5O_{12}:Ce^{3+}$ ("YAG:Ce") and $(Ba,Sr,Ca)_5(PO4)_3(Cl,F,OH):Eu^{2+},Mn^{2+},Sb^{3+}$. Non-limiting examples of red light emitting phosphors (peak emission in the range from about 610 nm to about 700 nm) are $Y_2O_3:Eu^{3+}$, $(Sr,Mg)_3(PO_4)_2:Sn^{2+}$, $YBO_3:Eu^{3+}$, and $3.5 MgO.0.5MgF_2.GeO_2:Mn^{4+}$.

The white light source may be fabricated to provide a point source device by using one UV/blue LED or a large-area lighting device by using a plurality of UV/blue LEDs. The term "large-area" means greater than about 10 cm$^2$.

Figure 4:
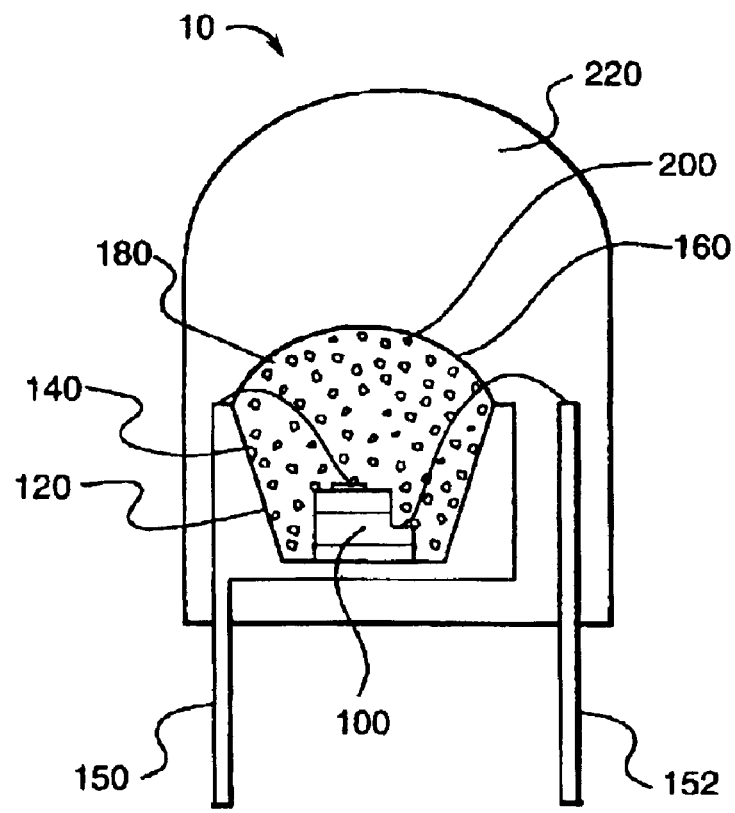
FIG. 4 shows an embodiment of a light source comprising a LED and at least a phosphor of the present invention.

In one embodiment of the present invention as shown in FIG. 4, a white light source 10 comprises a LED 100 emitting near UV-to-blue light in the range of about 350 nm to about 450 nm and a phosphor blend comprising a phosphor of the present invention. The LED 100 is mounted in a cup 120 having a reflective surface 140 adjacent LED 100. UV/blue LEDs suitable for white light-emitting devices are InGaN semiconductor-based LEDs such as those of U.S. Pat. No. 5,777,350 mentioned above, which is incorporated herein by reference. Other UV/blue LEDs also may be used, such as LEDs based on GaN semiconductor doped with various metals to provide a large band gap. Electrical leads 150 and 152 are provided to supply electrical power to the LED 100. A transparent casting 160 comprising an epoxy, a silicone, or glass 180 in which there are dispersed substantially uniformly particles 200 of the phosphor blend of the present invention. Alternatively, the phosphor particles may be applied on the LED 100 or dispersed in only a portion of the transparent casting 160. Other transparent polymers, such as polycarbonates, also may be used to form the transparent casting. In addition, particles of a light scattering material, such as TiO$_2$ or Al$_2$O$_3$, may be included in the transparent casting among the phosphor particles to improve the uniformity of the light emitted from the light source 10. The composition of the InGaN active layer of the LED and the quantity of the phosphor applied in the casting may be chosen such that a portion of the blue light emitted by the LED that is not absorbed by the phosphor and the broad-spectrum light emitted by the phosphor blend are combined to provide the white light source 10 of a desired color temperature and CRI. A white-light source such as one disclosed herein is suitable for back lighting or general illumination purposes.

A large-area white light source for general illumination may be produced by disposing a plurality of blue LEDs on a reflective panel, providing appropriate electrical leads to the individual LEDs, applying a coating comprising a phosphor blend of the present invention and a polymeric binder, such as an epoxy, and then sealing the whole combined structure in a transparent and hermetic seal. The phosphor blend/polymer coating may be applied directly on the individual LEDs or it may be applied over the entire panel surface. In the former case, an additional polymer coating may be applied over the entire panel surface after the phosphor blend has been applied on the LEDs. In addition, particles of a light-scattering solid, such as TiO$_2$ or Al$_2$O$_3$, may be provided in the polymer matrix to enhance the uniformity of the light emission from the device.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A phosphor comprising oxides of at least an alkaline-earth metal selected from the group consisting of strontium, barium, calcium, and combinations thereof and oxides of at least a Group-IIIB metal selected from the group consisting of aluminum, gallium, indium, and combination thereof, said phosphor being activated with ions of at least a rare-earth metal comprising at least europium, said phosphor having a formula of

$$(M_{1-x}RE_x)_y D_2 O_4;$$

wherein M is said at least an alkaline-earth metal; RE is said rare-earth metal comprising at least europium; D is said at least a Group IIIB metal; 0.001<x<0.3, and y satisfies a condition selected from the group consisting of 0.75<y<1 and 1<y<1.1.

2. The phosphor according to claim 1, wherein said phosphor absorbs electromagnetic radiation in a wavelength range from about 350 nm to about 480 nm and has an emission peak in a wavelength range from about 500 nm to about 600 nm.

3. The phosphor according to claim 1, wherein said phosphor is further doped with at least an additional rare-earth metal selected from the group consisting of cerium, praseodymium, neodymium, samarium, gadolinium, dysprosium, holmium, erbium, thulium, ytterbium, and lutetium.

4. The phosphor according to claim 3, wherein said at least an additional rare-earth metal comprises from about 0.001 to about 30 atom percent of a total of said at least an alkaline-earth metal, said europium, and said at least an additional rare-earth metal.

5. The phosphor according to claim 3, wherein said at least an additional rare-earth metal comprises from about 0.001 to about 20 atom percent of a total of said at least an alkaline-earth metal, said europium, and said at least an additional rare-earth metal.

6. The phosphor according to claim 3, wherein said at least an additional rare-earth metal comprises from about 0.001 to about 10 atom percent of a total of said at least an alkaline-earth metal, said europium, and said at least an additional rare-earth metal.

7. The phosphor according to claim 1, wherein said phosphor further comprises magnesium.

8. The phosphor according to claim 7, wherein said magnesium comprises from about 0.001 to about 20 atom percent of said at least an alkaline-earth metal.

9. A phosphor comprising oxides of strontium and aluminum, activated with ions of europium, said phosphor having a formula of $(Sr_{1-x}Eu_x)_yAl_2O_4;$ wherein $0.001<x<0.3$ and y satisfies a condition selected from the group consisting of $0.75<y<1$ and $1<y<1.1$.

10. A phosphor blend comprising:
(a) a first phosphor comprising oxides of at least an alkaline-earth metal selected from the group consisting of strontium, barium, calcium, and combinations thereof and oxides of at least a Group-IIIB metal selected from the group consisting of aluminum, gallium, indium, and combination thereof, said phosphor being activated with ions of at least a rare-earth metal comprising at least europium, said phosphor having a formula of $(M_{1-x}RE_x)_yD_2O_4;$ wherein M is said at least an alkaline-earth metal; RE is said rare-earth metal comprising at least europium; D is said at least a Group IIIB metal; $0.001<x<0.3$, and y satisfies a condition selected from the group consisting of $0.75<y<1$ and $1<y<1.1$; and
(b) at least an additional phosphor selected from the group consisting of phosphors that are excitable by radiation having wavelengths in a range from about 315 nm to about 480 nm that have a peak emission in at least one of blue, blue-green, green, yellow-orange, and red light wavelengths.

11. The phosphor blend according to claim 10, wherein said first phosphor further comprises magnesium in an amount from about 0.001 to about 20 atom percent of said alkaline-earth metal.

12. The phosphor blend according to claim 10, wherein said peak emission in said blue light wavelengths is in a range from about 400 nm to about 480 nm.

13. The phosphor blend according to claim 10, wherein said peak emission in said blue-green light wavelengths is in a range from about 480 nm to about 500 nm.

14. The phosphor blend according to claim 10, wherein said peak emission in said green light wavelengths is in a range from about 500 nm to about 550 nm.

15. The phosphor blend according to claim 10, wherein said peak emission is said red light wavelengths is in a range from about 610 nm to about 700 nm.

16. A phosphor blend comprising:
(a) a first phosphor comprising oxides of at least an alkaline-earth metal selected from the group consisting of strontium, barium, calcium, and combinations thereof and oxides of at least a Group-IIIB metal selected from the group consisting of aluminum, gallium, indium, and combination thereof, said phosphor being activated with ions of at least a rare-earth metal comprising at least europium, said phosphor having a formula of $(M_{1-x}RE_x)_yD_2O_4;$ wherein M is said at least an alkaline-earth metal;RE is said rare-earth metal comprising at least europium; D is said at least a group IIIB metal; $0.001<x<0.3$, and y satisfies a condition selected from the group consisting of $0.75<y<1$ and $1<y<1.1$; and
(b) at least an additional phosphor selected from the group consisting of phosphor that are excitable by radiation having wavelengths in a range from about 315 nm to about 480 nm that have a peak emission in at least one blue, blue-green, green, yellow-orange, and red light wavelengths, wherein said peak emission in said yellow-orange light wavelengths is in a range from about 550 to about 630 nm.

17. A phosphor blend comprising $Sr_{0.8}Eu_{0.1}Al_2O_4$, $Ca_5(PO_4)_3Cl:Mn^{2+},Eu^{2+}$, and $(Sr,Ba,Ca)_5(PO_4)_3(Cl,OH):Eu^{2+}$.

18. A method for producing a phosphor, said method comprising:
(a) providing amounts of oxygen-containing compounds of at least a rare-earth metals comprising at least europium; at least an alkaline-earth metal selected from the group consisting of strontium, barium, calcium, and combinations thereof; and at least a Group-IIIB metal selected from the group consisting of aluminum, gallium, indium, and combinations thereof;
(b) mixing together said oxygen-containing compounds to form a mixture; and
(c) firing said mixture in a reducing atmosphere at a temperature and for a time sufficient to convert said mixture to said phosphor having a formula of $(M_{1-x}RE_x)_yD_2O_4;$ wherein M is said at least an alkaline-earth metal; RE is said rare-earth metal comprising at least europium; D is said at least a Group IIIB metal; $0.001<x<0.3$, and y satisfies a condition selected from the group consisting of $0.75<y<1$ and $1<y<1.1$.

19. The method according to claim 18 further comprising adding at least a halide of at least a metal selected from the group consisting of rare-earth metals, strontium, barium, calcium, aluminum, gallium, indium, and combinations thereof.

20. The method according to claim 18, wherein said oxygen-containing compounds are oxides.

21. The method according to claim 18, wherein said firing is carried out at a temperature in a range from about 900° C. to about 1300° C.

22. The method according to claim 18, wherein said firing is carried out at a temperature in a range from about 1000° C. to about 1100° C.

23. The method according to claim 18, wherein said firing is carried out at a substantially constant temperature.

24. The method according to claim 18, wherein said firing is carried out for a time from about 1 minute to about 10 hours.

25. The method according to claim 18, wherein said firing is carried out in an atmosphere comprising a gas selected from the group consisting of hydrogen and carbon monoxide.

26. A method for producing a phosphor, said method comprising:
(a) providing amounts of oxygen-containing compounds of at least a rare-earth metals comprising at least europium; at least an alkaline-earth metal selected from the group consisting of strontium, barium, calcium, and combinations thereof: and at least a Group-IIIB metal selected from the group consisting of aluminum, gallium, indium, and combinations thereof;
(b) mixing together said oxygen-containing compounds to form a mixture; and
(c) firing said mixture in a reducing atmosphere at a temperature and for a time sufficient to convert said mixture to said phosphor having a formula of $(M_{1-x}RE_x)_yD_2O_4;$ wherein M is said at least an alkaline-earth metal; RE is said rare-earth metal comprising at least europium; D is said at least a Group IIIB metal; 0.001<x<0.3, and y satisfies a condition selected from the group consisting of 0.75<y<1 and 1<y<1.1, and wherein said temperature is ramped from ambient temperature to a final temperature. nitrogen.

27. method for producing a phosphor, said method comprising:
  (a) providing amounts of oxygen-containing compounds of at least a rare-earth metals comprising at least europium; at least an alkaline-earth metal selected from the group consisting of strontium, barium, calcium, and combinations thereof; and at least a Group-IIIB metal selected from the group consisting of aluminum, gallium, indium, and combinations thereof;
  (b) mixing together said oxygen-containing compounds to form a mixture: and
  (c) firing said mixture in a reducing atmosohere at a temperature and for a time sufficient to convert said mixture to said phosphor having a formula of $(M_{1-x}RE_x)_yD_2O_4$;

wherein M is said at least an alkaline-earth metal; RE is said rare-earth metal comprising at least europium; D is said at least a Group IIIB metal; 0.001<x<0.3, and y satisfies a condition selected from the group consisting of 0.75<y<1 and 1<y<1.1, and wherein said firing is carried out in an atmosphere comprising from about 1 to about 3 volume percent hydrogen in nitrogen.

28. A method for producing a phosphor, said method comprising:
  (a) providing amounts of compounds of at least a rare-earth metals comprising at least europium; at least an alkaline-earth metal selected from the group consisting of strontium, barium, calcium, and combinations thereof, and at least a Group-IIIB metal selected from the group consisting of aluminum, gallium, indium, and combinations thereof;
  (b) mixing together said compounds to form a mixture;
  (c) heating said mixture to convert said mixture to a mixture of oxides; and
  (d) firing said mixture of oxides in a reducing atmosphere at a temperature and for a time sufficient to convert said mixture to said phosphor having a formula of $(M_{1-x}RE_x)_yD_2O_4$;

wherein M is said at least an alkaline-earth metal; RE is said rare-earth metal comprising at least europium; D is said at least a Group IIIB metal; 0.001<x<0.3, and y satisfies a condition selected from the group consisting of 0.75<y<1 and 1<y<1.1.

29. The method according to claim 28, wherein said compounds are selected from the group consisting of carbonates, nitrates, nitrides, sulfates, sulfites, chlorates, perchlorates, oxyhalides, acetates, citrates, salts of organic acids, and combinations thereof.

30. The method according to claim 28 further comprising adding further comprising adding at least a halide of at least a metal selected from the group consisting of rare-earth metals, strontium, barium, calcium, aluminum, gallium, indium, and combinations thereof.

31. The method according to claim 28, wherein said heating is carried out at a temperature in a range from about 400° C. to about 900° C.

32. The method according to claim 28, wherein said heating is carried out in an oxygen-containing gas.

33. The method according to claim 28, wherein said firing is carried out at a temperature in a range from about 900° C. to about 1300° C.

34. The method according to claim 28, wherein said firing is carried out at a temperature in a range from about 1000° C. to about 1100° C.

35. The method according to claim 28, wherein said firing is carried out at a substantially constant temperature.

36. The method according to claim 28, wherein said temperature is ramped from ambient temperature to a final temperature.

37. The method according to claim 28, wherein said firing is carried out for a time from about 1 minute to about 10 hours.

38. The method according to claim 28, wherein said firing is carried out in an atmosphere comprising a gas selected from the group consisting of hydrogen and carbon monoxide.

39. The method according to claim 28, wherein said firing is carried out in an atmosphere comprising from about 1 to about 3 volume percent hydrogen in nitrogen.

40. A method for producing a phosphor, said method comprising:
  (a) providing a first solution comprising compounds of at least a rare-earth metals comprising at least europium; at least an alkaline-earth metal selected from the group consisting of strontium, barium, calcium, and combinations thereof; and at least a Group-IIIB metal selected from the group consisting of aluminum, gallium, indium, and combinations thereof, said compounds being selected from the group consisting of nitrates, sulfates, acetates, citrates, chlorates, perchlorates, oxyhalides, salts of organic acids containing 1 to 6 carbon atoms, esters of di-carboxylic acids containing 1 to 6 carbon atoms, salts of aromatic acids having 1 to 2 aromatic rings, acetylacetonates, alkoxides, phenoxides, and mixtures thereof;
  (b) providing a second solution comprising a material selected from the group consisting of ammonium hydroxide, ammonium carbonate, ammonium oxalate, methanolamine, ethanolamine, propanolamine, dimethanolamine, diethanolamine, dipropanolamine, trimethanolamine, triethanolamine, or tripropanolamine, and mixtures thereof;
  (c) adding said second solution to said first solution to form a precipitate; and
  (d) firing said precipitate in a reducing atmosphere at a temperature and for a time sufficient to convert said mixture to said phosphor having a formula of $(M_{1-x}RE_x)_yD_2O_4$;

wherein M is said at least an alkaline-earth metal; RE is said rare-earth metal comprising at least europium; D is said at least a Group IIIB metal; 0.001<x<0.3, and y satisfies a condition selected from the group consisting of 0.75<y<1 and 1<y<1.1.

41. The method according to claim 40 further comprising adding at least a halide of at least a metal selected from the group consisting of rare-earth metals, strontium, barium, calcium, aluminum, gallium, indium, and combinations thereof.

42. The method according to claim 40 further comprising heating said precipitate at a temperature in a range from about 400° C. to about 900° C. before the step of firing.

43. The method according to claim 42, wherein said heating is carried out in an oxygen-containing gas.

44. The method according to claim 42, wherein said firing is carried out at a temperature in a range from about 900° C. to about 1300° C.

45. The method according to claim 42, wherein said firing is carried out at a temperature in a range from about 1000° C. to about 1100° C.

46. The method according to claim 42, wherein said firing is carried out at a substantially constant temperature.

47. The method according to claim 42, wherein said temperature is ramped from ambient temperature to a final temperature.

48. The method according to claim 42, wherein said firing is carried out for a time from about 1 minute to about 10 hours.

49. The method according to claim 42, wherein said firing is carried out in an atmosphere comprising a gas selected from the group consisting of hydrogen and carbon monoxide.

50. The method according to claim 42, wherein said firing is carried out in an atmosphere comprising from about 1 to about 3 volume percent hydrogen in nitrogen.

51. A light source comprising:
(a) at least one LED that is capable of emitting a radiation having wavelengths in a range from about 315 nm to about 480 nm; and
(b) a phosphor casting comprising a transparent material and particles of a phosphor blend comprising:
(1) a first phosphor comprising oxides of at least an alkaline-earth metal selected from the group consisting of strontium, barium, calcium, and combinations thereof and oxides of at least a Group-IIIB metal selected from the group consisting of aluminum, gallium, indium, and combination thereof, said phosphor being activated with ions of at least a rare-earth metal comprising at least europium, said phosphor having a formula of $(M_{1-x}RE_x)_yD_2O_4$;

wherein M is said at least an alkaline-earth metal; RE is said rare-earth metal comprising at least europium; D is said at least a Group IIIB metal; $0.001<x<0.3$, and y satisfies a condition selected from the group consisting of $0.75<y<1$ and $1<y<1.1$; and
(2) at least an additional phosphor selected from the group consisting of phosphors that are excitable by radiation having wavelengths in a range from about 315 nm to about 480 nm that have a peak emission in at least one of blue, blue-green, green, yellow-orange, and red light wavelengths.

52. The light source according to claim 51, wherein said first phosphor further comprises magnesium in an amount from about 0.001 to about 20 atom percent of said at least an alkaline-earth metal.

53. The light source according to claim 51, wherein said phosphor casting further comprises particles of a light-scattering material.

54. The light source according to claim 51, wherein said peak emission in said blue light wavelengths is in a range from about 400 nm to about 480 nm.

55. The light source according to claim 51, wherein said peak emission in said blue-green light wavelengths is in a range from about 480 nm to about 500 nm.

56. The light source according to claim 51, wherein said peak emission in said green light wavelengths is in a range from about 500 nm to about 550 nm.

57. The light source according to claim 51, wherein said peak emission in said red light wavelengths is in a range from about 610 nm to about 700 nm.

58. A light source comprising:
(a) at least one LED that is capable of emitting a radiation having wavelengths in a range from about 315 nm to about 480 nm; and
(b) a phosphor casting comprising a transparent material and particles of a phosphor blend comprising:
(1) a first phosphor comprising oxides of at least an alkaline-earth metal selected from the group consisting of strontium, barium, calcium, and combinations thereof and oxides of at least a Group-IIIB metal selected from the group consisting of aluminum, gallium, indium, and combination thereof, said phosphor being activated with ions of at least a rare-earth metal comprising at least europium, said phosphor having a formula of $(M_{1-x}RE_x)_yD_2O_4$;

wherein M is said at least an alkaline-earth metal; RE is said rare-earth metal comprising at least europium; D is said at least a Group IIIB metal; $0.001<x<0.3$, and y satisfies a condition selected from the group consisting of $0.75<y<1$ and $1<y<1.1$; and
(2) at least an additional phosphor selected from the group consisting of phosphors that are excitable by radiation having wavelengths in a range from about 315 nm to about 480 nm that have a peak emission in at least one of blue, blue-green, green, yellow-orange, and red light wavelengths, wherein said peak emission in said yellow-orange light wavelengths is in a range from about 550 nm to about 630 nm.

59. A light source comprising:
(a) at least one LED that is capable of emitting a radiation having wavelengths in a range from about 315 nm to about 480 nm; and
(b) a phosphor casting comprising a transparent material and particles of a phosphor blend comprising $Sr_{0.8}Eu_{0.1}Al_2O_4$, $Ca_5(PO_4)_3Cl:Mn^{2+}$, $Eu^{2+}$, and $(Sr,Ba,Ca)_5(PO_4)_3(Cl,OH):Eu^{2+}$.

60. The light source according to claim 59, wherein said phosphor casting further comprises particles of a light-scattering material.

61. A light source comprising:
(a) a plurality of LEDs attached to a reflective panel, said LEDs being capable of emitting a radiation having wavelengths in a range from about 315 nm to about 480 nm; and
(b) a phosphor coating comprising a polymeric binder and particles of a phosphor blend dispersed therein, said coating being disposed in a direction of radiation emitted from said LEDs, said phosphor blend comprising:
(1) a first phosphor comprising oxides of at least an alkaline-earth metal selected from the group consisting of strontium, barium, calcium, and combinations thereof and oxides of at least a Group-IIIB metal selected from the group consisting of aluminum, gallium, indium, and combination thereof, said phosphor being activated with ions of at least a rare-earth metal comprising at least europium, said phosphor having a formula of $(M_{1-x}RE_x)_yD_2O_4$;

wherein M is said at least an alkaline-earth metal; RE is said rare-earth metal comprising at least europium; D is said at least a Group IIIB metal; $0.001<x<0.3$, and y satisfies a condition selected from the group consisting of $0.75<y<1$ and $1<y<1.1$; and (2) at least an additional phosphor selected from the group consisting of phosphors that are excitable by radiation having wavelengths in a range from about 315 nm to about 480 nm that have a peak emission in at least one of blue, blue-green, green, yellow-orange, and red light wavelengths.

62. The light source according to claim 61, wherein said coating further comprises particles of a light-scattering material.

63. The light source according to claim 61 further comprising a seal disposed around a totality of said panel, said LEDs, and said phosphor coating.

64. A light source comprising:

(a) a plurality of LEDs attached to a reflective panel, said LEDs being capable of emitting a radiation having wavelengths in a range from about 315 nm to about 480 nm; and (b) a phosphor coating comprising a polymeric binder and particles of a phosphor blend dispersed therein, said coating being disposed in a direction of radiation emitted from said LEDs, said phosphor blend comprising $Sr_{0.8}Eu_{0.1}Al_2O_4$, $Ca_5(PO_4)_3Cl:Mn^{2+}Eu^{2+}$, and $(Sr,Ba,Ca)_5(PO_4)_3(Cl,OH):Eu^{2+}$.

* * * * *